United States Patent

[11] 3,615,466

[72] Inventor Ravinder J. Sahni
Essex Junction, Vt.
[21] Appl. No. 777,014
[22] Filed Nov. 19, 1968
[45] Patented Oct. 26, 1971
[73] Assignee International Business Machines Corporation
Armonk, N.Y.

[54] PROCESS OF PRODUCING AN ARRAY OF INTEGRATED CIRCUITS ON SEMICONDUCTOR SUBSTRATE
6 Claims, 3 Drawing Figs.

[52] U.S. Cl. .......... 96/36.2, 96/44, 117/5.5, 117/212, 29/574, 29/576, 29/577, 340/173 R
[51] Int. Cl. .......... G03c 5/04
[50] Field of Search .......... 96/36.2, 44; 117/212; 29/576, 576 O, 577

[56] References Cited
UNITED STATES PATENTS

| | | | |
|---|---|---|---|
| 3,245,794 | 4/1966 | Conley .......... | 96/36.2 |
| 3,317,320 | 5/1967 | Reber .......... | 96/36.2 |
| 3,385,702 | 5/1968 | Koehler .......... | 96/44 |
| 3,508,209 | 4/1970 | Agusta et al. .......... | 340/173 |

*Primary Examiner*—Murray Katz
*Attorneys*—Hanifin and Clark and Willis E. Higgins

ABSTRACT: Defect-free integrated circuit patterns in masks which are overlayed by a mask matching process used for different processing steps to expose photoresist in arrays of patterns for semiconductor circuits on a wafer may be weighted prior to matching in accordance with different process yield regions of the array. Weighting the defect-free patterns in this manner provides a way of concentrating the defect-free locations in the masks in the high process yield regions of the wafer.

INVENTOR.
RAVINDER J. SAHNI
BY Willis E. Higgins
ATTORNEY

PROCESS OF PRODUCING AN ARRAY OF INTEGRATED CIRCUITS ON SEMICONDUCTOR SUBSTRATE

FIELD OF THE INVENTION

This invention relates to processes for overlaying defect-free patterns in a plurality of masks used for different processing steps in the manufacture of integrated circuits and other arrays of patterns on a substrate. Such processes are hereinafter referred to as mask matching processes. More particularly the invention relates to a mask matching process which is correlated with differences in process yield.

CROSS-REFERENCE TO RELATED APPLICATIONS

The application covers an improvement in the processes disclosed and claimed in the copending and commonly assigned application of Arthur H. DePuy, Ser. No. 777,011, and the copending and commonly assigned application of William N. Kuschel, Ser. No. 777,012, filed on the same day as the present application.

DESCRIPTION OF THE PRIOR ART

Processes for producing an array of patterns, such as integrated circuits, on a substrate, such as a semiconductor wafer, using a plurality of masks having an array of patterns in a series of processing steps, are well known. Agusta et al., application Ser. No. 539,210, filed Mar. 31, 1966, entitled "-Monolithic Integrated Structure Including Fabrication and Package Therefor," now U.S. Pat. No. 3,508,209, assigned to the same assignee as the present application, discloses such a process. In such processes, a semiconductor wafer having an oxidized surface or other substrate is coated with photoresist, the photoresist is exposed through a mask having an array of patterns, the exposed photoresist is developed, and a pattern is etched to remove oxide in the wafer on those areas where the photoresist is not exposed. An impurity may then be diffused into the unoxidized semiconductor material exposed by the etching step. The process disclosed in the Agusta et al. application is used to produce an array of highly complex, closely spaced, integrated circuits on a semiconductor wafer.

In the production of such patterns on a substrate in this manner, defects in the masks are reproduced on the substrate. Such defects occur in a random fashion on the masks. These defects may be scratches on the masks, photoemulsion that was not removed in fabrication of the mask itself, areas of the mask where photoemulsion was removed where it should not have been removed, or other imperfections.

Even if most of the patterns in the array on each mask do not contain a defect, randomly occurring defects will produce defective patterns in most of the array if seven or eight masking steps are used to produce the array of patterns. For example, if 80 percent of the patterns in the array on each mask are defect free, randomly occurring defects on the patterns in the masks will reduce the maximum possible yield of patterns containing no defects obtained by using such masks in a process that requires eight different masking operations to about 17 percent. This yield figure assumes that no additional defects in the patterns will be produced by any other cause than defects in the masks. With an increased number of different masking steps, the maximum possible yield decreases exponentially. Semiconductor manufacturing processes involving, for example, 25 different masking steps therefore cannot be carried out on a practical basis unless something is done to reduce the number of defective integrated circuits produced by these randomly occurring mask defects.

U.S. Pat. No. 3,317,320, issued May 2, 1967, discloses one proposed solution for the problem of random mask defects. In the process there disclosed, two different masks having the same predetermined pattern are employed for each masking step required, either with or without the application of an additional layer of photoresist between the application of the two masks. While the array of predetermined patterns is the same on these two masks, the random distribution of defects is different.

This process reduces the effect of random mask defects, but it doubles the number of masking operations that must be carried out in a semiconductor manufacturing process which employs it. Additionally, the second mask having the same array of predetermined patterns must be registered very precisely in alignment with the image produced by the first mask.

Another proposed solution for the problem of random mask defects is touching up the masks themselves to correct them, as disclosed in commonly assigned U.S. Pat. No. 3,358,702 to Koehler, issued May 28, 1968. This approach, although very useful with some masks, is difficult to carry out when the patterns are very small and closely spaced, as in the case of present day monolithic integrated circuits on semiconductor wafers.

Another possible approach to the problem of random mask defects is to use higher quality masks. However, masks having even 20 percent of the integrated circuits in their arrays containing defects are very difficult to make, even with the very best mask fabrication technology. With the present state of mask fabrication technology, this approach is not practical.

A further problem in the prior art is the fact that a great deal of difficulty has been encountered in determining whether an apparent mask defect will in fact cause a defective integrated circuit at the array position containing the defect. Defective integrated circuits are often produced by mask defects which appear to be so slight as to cause no problem. Nondefective integrated circuits are at times produced at array positions containing apparently serious mask defects. Therefore, manufacturing process which can maintain identification of mask locations in the array is needed. This information and the yield of nondefective integrated circuits from array locations containing possible defects in one or more of the masks would be very valuable in determining proper criteria for classifying particular circuit patterns on the masks as defective in fact. A related use of this information would be to determine whether defective circuits in an array are caused by mask defects or by the manufacturing process itself.

Thus, a serious problem exists in reducing the effect of randomly occurring mask defects on integrated circuit yields in processes requiring a plurality of masking steps. Further, a serious problem exists in the lack of ability to characterize accurately given integrated circuit patterns on masks as in fact defective.

SUMMARY OF THE INVENTION

The above problems in the prior art may be overcome through use of a mask matching process. The present invention improves mask matching processes of the type disclosed and claimed in the above-mentioned DePuy application and Kuschel application. In the disclosed DePuy process, masks used for different processing steps to expose photoresist in arrays of patterns for semiconductor circuits on a wafer are matched by combining one mask for each processing step in all possible combinations, then selecting the combination for use which will minimize the number of defective integrated circuits in the array. The Kuschel process improves the DePuy process by matching the masks sequentially. This is done by selecting a mask for one of the processing steps, then choosing masks one step at a time for the remaining processing steps in the fabrication of an array of integrated circuits on a semiconductor wafer. The DePuy process enables a very marked improvement in semiconductor process yield to be obtained. The Kuschel process obtains virtually all of the benefit of the DePuy process but requires only a small fraction of the comparisons that must be made in the DePuy process.

In semiconductor manufacturing, the yield of monolithic circuits that will meet test specifications is a function of the location of the circuit on the semiconductor wafer. There are a number of reasons why this may occur. Semiconductor wafers are more susceptible to handling losses at their edges during processing. When masks are applied to a semiconductor wafer, their images must be precisely aligned on top of the patterns already produced on the wafer in previous process steps. This alignment is carried out at reference points near the edge of the wafer. The precision of the alignment increases radially toward the center of the wafer. Finally, process conditions, such as temperature, concentration of diffusion dopant, and the like may vary over the surface of the wafer as a result of process chamber configuration. As a result of these or other possible factors, it may be stated that the closer a particular circuit location is to the center of the semiconductor wafer, the higher will be the processing yield from that location. This difference in processing yield based on circuit location means that the highest yields of defect-free monolithic circuits in a production run may not be obtained with that combination of masks having the greatest number of defect free locations in the masks. Therefore, a need to compensate for yield differences based on array locations exists in mask matching processes.

Accordingly, it is an object of this invention to increase the yield of defect-free patterns obtained in a semiconductor manufacturing process for making an array of patterns on a substrate which utilizes mask matching.

It is a further object of the invention to correlate mask selection in a mask matching process with processing yield in the array.

It is yet another object of the invention to concentrate the defect-free semiconductor device patterns of an array in a combination of masks selected by a mask matching process within the high processing yield regions of the array.

These and other related objects may be obtained through use of this invention, which is an improvement in a process for overlaying defect-free patterns in masks of different levels for producing an array of patterns on a substrate. In accordance with the invention, regions of approximately equal processing yield of defect-free patterns in the array are determined. A weighted value is assigned to the patterns in the regions based on their relative processing yields. A combination of masks for the different levels is then selected on the basis of the number and weight of the defect-free patterns in the array to maximize the potential number of defect-free integrated circuits which may be produced in the array using the selected combination of masks.

The invention therefore makes use of the variation in yield obtained in an array of patterns based on location. In essence, this phenomenon is utilized to determine the potential yield of defect-free patterns for each combination of masks. The combination of masks with the largest value of the potential yield may then be selected for use. The large variations in yield based on array location in the fabrication of an array of integrated circuit devices makes the invention of particular value in such manufacturing processes. However, the increased yields obtainable through use of this invention make it of value for essentially any process for producing an array of patterns on a substrate, as long as there is a variation in processing yield of these patterns based on their location in the array.

It should be noted that the process of this invention will often result in the selection of mask combinations that would ordinarily not be selected in a mask matching process. If a smaller number of defect-free locations are concentrated in a high processing yield region of the array for one mask combination, this process would result in the choice of that combination over a second combination having more defect-free locations but concentrated in low processing yield regions of the array. A mask matching process without weighting would choose the second combination, and therefore result in fewer defect-free patterns on the substrate.

The foregoing and other objects, features, and advantages of the invention will be apparent from the following more particular description of the preferred embodiments of the invention, as illustrated in the accompanying drawings.

DESCRIPTION OF THE PREFERRED EMBODIMENT

Figure 1:
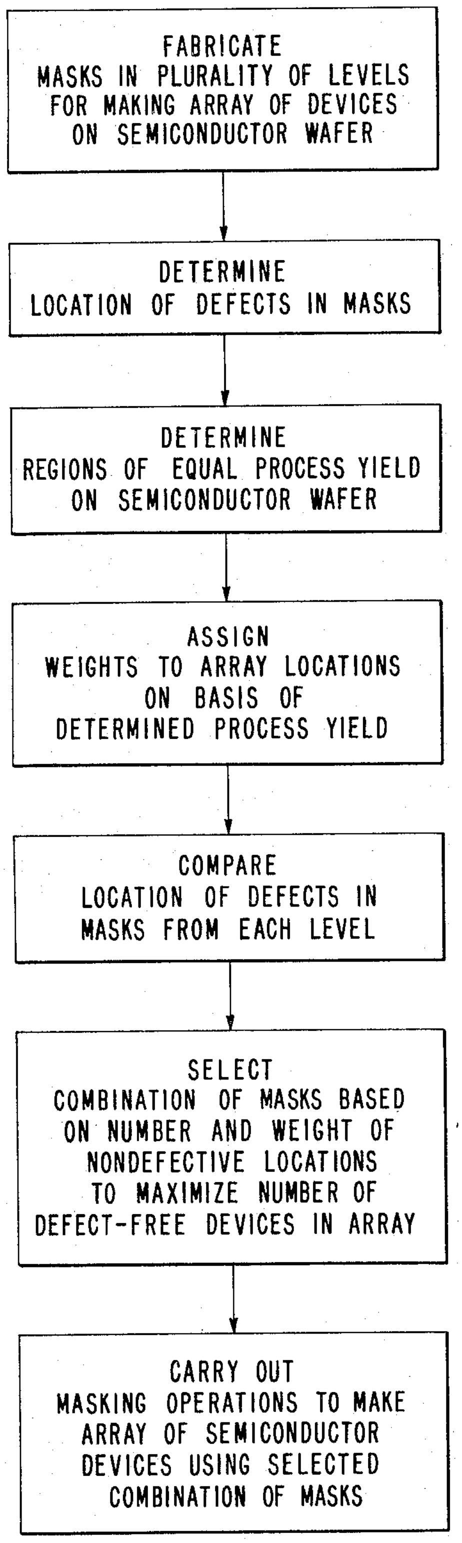
FIG. 1 is a flow diagram of the claimed process.

Referring now to the drawings, more particularly to FIG. 1, there is shown a flow diagram of a weighted mask matching process, showing its basic features. The first step in the process is to fabricate masks in a plurality of levels for making an array of devices on a semiconductor wafer. A number of masks for each level in the process are fabricated, so that a choice may be made of a particular mask to use for a given level. Reference is made to the above cited copending Agusta et al. application Ser. No. 539,210, for examples of such masks. The masks there shown depict only one pattern in the array. The actual mask itself consists of an array containing a large number of the patterns shown.

As indicated in that application, the mask patterns shown are greatly enlarged. Fabrication of an array of these patterns in very small size (e.g., about 0.06 inch by 0.06 inch each) is extremely difficult. In the fabrication of an array of such patterns, random defects occur which make the pattern defective where they occur. Consequently, semiconductor devices produced using the defective member of the array are themselves defective. The next step in the process is to determine the location of these random defects on the masks fabricated in step one. This is usually done by visual inspection of the masks.

The next step in the process is to determine regions of approximately equal process yield on the semiconductor wafer. This may be done by carrying out the manufacturing process for a sufficient length of time to give a large enough number of runs for valid yield information. The yields for the different array locations are likely to change with time, as more experience in the particular fabrication process is gained. Periodically, the process yields should be checked to see if the determined regions of equal process yield remain valid.

On the basis of the differences in the relative yields in these regions of equal process yield, weights are assigned to the array locations. These weights are an indication that a defect-free location in the masks at a high process yield region is of substantially more value than a defect-free location in the masks at a low process yield region.

The next step in the process is to compare the location of defects in masks from each level for the purpose of obtaining defect-free locations in the combination. A combination of masks is then selected based on the number and weight of the nondefective locations in the combination of masks to maximize the potential number of defect-free devices produced in the array using the combination. A series of masking operations in the fabrication of an array of semiconductor devices is then carried out using the selected combination masks.

Figure 2:
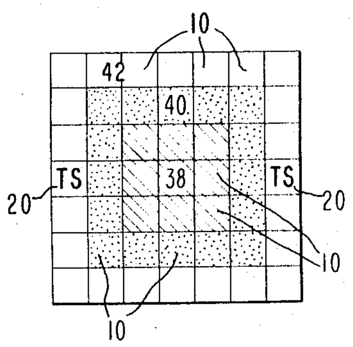
FIG. 2 is a representation of regions of approximately equal yield in the fabrication of an array of semiconductor devices.

FIG. 2 in the drawings represents an array of 49 integrated circuits 10 as produced on a semiconductor wafer. Two of these integrated circuit locations have been designated as test sites 20 and need not be of further concern in this application. The three regions 38, 40, and 42 shown in the array represent regions of substantially equal process yield as determined through use of the semiconductor manufacturing process described in the above-mentioned copending Agusta et al. application Ser. No. 539,210. A quantity of 2,257 defect-free integrated circuits produced by the Agusta et al. process were used to obtain the regions shown in FIG. 2. By observing the relative numbers of the integrated circuits 10 which are defect-free coming from the different array positions on the semiconductor wafers, these regions of approximately equal yield were determined. The following table shows the data obtained from the 2,257 integrated circuits.

| Region | Number of chip locations | Observed number of functional chips | Yield per chip location | Normalized yield per chip location |
|---|---|---|---|---|
| 38 | 9 | 782 | 86.9 | 50.5 |
| 40 | 16 | 1,066 | 6,616 | 38.7 |
| 42 | 22 | 409 | 18.6 | 10.8 |

The normalized yield per chip location as shown in the above table gives the relative weighting factors that should be used for the three regions 38, 40 and 42 based on the sample of integrated circuit chips evaluated. For the purpose of this application, these weighting factors may be considered as 5, 4, and 1, respectively.

Using these weighting factors, the potential yield of defect-free integrated circuits for each combination of masks may be calculated by the relationship:

$P_y = n_1 w_1 + n_2 w_2 + n_3 w_3$ in which $P_y$ is the potential yield of integrated circuits that may be obtained with the mask combination, $n_1$, $n_2$, and $n_3$ are the numbers of defect-free integrated circuit locations in regions 38, 40, and 42 of equal process yield in the array, and $w_1$, $w_2$, and $w_3$ are the weights assigned to the regions 38, 40, and 42.

The combination of masks having the largest value of potential yield is selected for use in the fabrication of the integrated circuit devices. The potential yield does not represent the actual yield that will be obtained from using a particular combination, but is is proportional to the actual yield that should be obtained.

The mask combinations and selection may be made in accordance with either the mask matching embodiment disclosed in the above-mentioned copending DePuy application or the embodiment disclosed in the copending Kuschel application. Therefore, one mask for each of the steps may be combined in all possible combinations and the best combination selected to maximize yield based on the number and weight of the defect-free positions. Alternatively, the nondefective locations may be compared and selection of a mask combination carried out by taking a mask from a first one of the levels Preferably, this mask is the one available for use in the level containing the fewest number of defects. The defect-free locations in masks from a second one of the levels is then compared with the defect-free locations in the mask from the first one of the levels. A mask from the second level may then be selected on the basis of the number and weight of the defect-free array locations to maximize the number of defect-free patterns that can be produced with the combination of first and second level masks. This approach is continued by comparing the nondefective locations in masks from a third one of the levels with the nondefective locations in the selected combinations of first and second level masks. A mask is then selected from the third level on the basis on the number and weight of the defect-free array locations to maximize the number of defect-free semiconductor devices that can be produced with the combination of first, second and third level masks. In like manner, the comparison and selection may be continued for additional mask levels. In each case, the masks for the level concerned are compared with the number and weight of common defect-free array locations with the previously selected masks.

The actual matching may be carried out through the use of clear plastic cards with the defect locations for the masks indicated on them. In this method the weights for the defects-free locations in each mask combination must be separately calculated through use of the formula given previously.

The invention may be more conveniently carried out through use of a suitably programmed computer having the defect locations on the masks and the weighting factors for the regions in the array stored in its memory. For details on carrying out mask matching by either the plastic card approach or the computer approach, reference is made to the DePuy application and the Kuschel application.

The following example illustrates the practice of the invention:

A semiconductor manufacturing process in which nine different masking steps were used to prepare an array of 47 semiconductor devices on wafers was carried out using the invention. For comparison purposes mask combinations for the manufacturing process were also selected by mask matching without weighting high process yield regions of the array. The regions of approximately equal process yield in this process corresponded to those shown in FIG. 2 of the drawings, but the determined weighting factors were 4, 3, and 1.

Seven different mask combinations were selected for the manufacturing process from masks having the average percentages of defect-free patterns at each level in their array shown in the following table:

Table I

| Mask Level | Average % of defect-free patterns in array |
|---|---|
| A | 90% |
| B | 80 |
| C | 84 |
| D | 85 |
| E | 82 |
| F | 82 |
| G | 78 |
| H | 90 |
| I | 90 |

A quantity of 100 actual masks were available for each level except G, for which only 30 masks were available. The mask matching was carried out on a suitably programmed IBM 1800 computer using the sequential mask matching process of the above-mentioned copending Kuschel application, both with and without the use of the weighting factors for the defect-free array locations.

When the weighting factors of 4, 3, and 1 were used for the regions 38, 40 and 42, respectively, as shown in FIG. 2, an average of 20 defect-free array positions out of the 47 was obtained in the seven combinations selected. An average potential yield ($P_y$) of 58 was obtained by the computer for these seven combinations from the formula given previously.

When no weighting factors were employed in the sequential mask matching, an average of 22 defect-free array positions were obtained in the selected combinations. On the basis of the formula, these array positions would have given average potential yield ($P_y$) of 49. Therefore, the combinations selected with weighted mask watching were used to make the semiconductor devices.

The difference in the combinations selected with and without weighting may be seen from the following table II, which given the average distribution of the defect-free devices obtained in the seven combinations selected each way.

TABLE II

| | No. of Defect-Free Array Positions | Distribution in Array Regions 38 | 40 | 42 |
|---|---|---|---|---|
| With Weighting | 20 | 6.5 | 9.2 | 4.3 |
| Without Weighting | 22 | 4.2 | 7.5 | 10.3 |

Thus, though mask matching without weighting gave more defect-free array positions, almost half of these positions were in the lowest-yield region of the semiconductor wafer. In contract, less than one quarter of the defect-free array positions in the combinations selected with weighting were in the lowest-yield region of the semiconducotr wafer.

USE OF SELECTED MASKS

Figure 3:
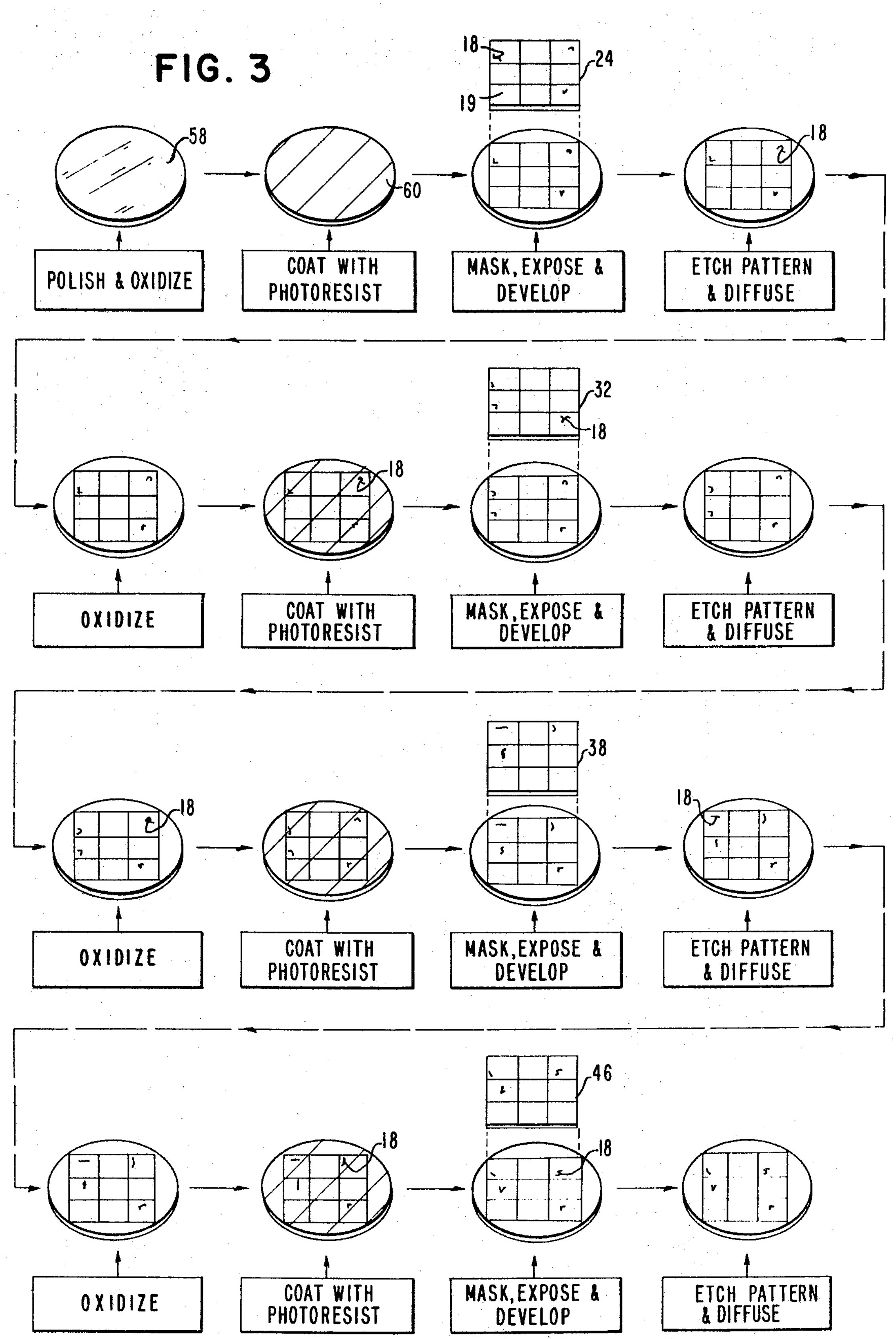
FIG. 3 shows the use of a combination of masks selected in accordance with the invention to produce an array of semiconductor devices on a wafer.

FIG. 3 shows how the masks selected by this mask matching process are used to make semiconductor devices on a wafer 58 of silicon or other semiconductor material. The wafer is first polished to a smooth surface and then oxidized. The oxidized wafer 58 is then coated with a layer of photoresist 60. An A level mask 24 containing a first pattern (not shown) desired to be reproduced in the photoresist 60 is aligned on the surface of the photoresist coated wafer. The photoresist is exposed to suitable light through the mask, then the photoresist is developed to remove either the exposed or unexposed areas, depending on whether a negative or positive photoresist is used. An etching operation is then carried out on the wafer 58. The photoresist 60 remaining on the surface of the wafer after the developing step prevents etching from taking place on the areas of the wafer covered by it. Defects 18 in the mask 24, as well as the desired pattern, as contained in defect-free areas 19, are reproduced in the photoresist 60.

The etching operation removes the oxide layer from the wafer 58 in the areas not covered by photoresist 60 to expose elemental silicon. An impurity, such as boron, arsenic or phosphorus, may now be diffused into the elemental silicon to change its electrical conductivity characteristics.

As shown in FIG. 3, the oxidation, photoresist coating, masking, exposing, developing, etching, and diffusion steps are repeated utilizing B level mask 32, C level mask 38, and D level mask 46 to produce the desired effects in wafter 58. In addition to or alternatives to the four diffusion steps shown in FIG. 3, other processing operations on the elemental silicon exposed by the etching process may be carried out, such as epitaxial growth of silicon. Also, masks selected in accordance with the invention may be used to produce other types of patterns on the semiconductor wafer, such as aluminum conducting lines joining individual monolithic components in the circuits being produced. For further details on such monolithic integrated structure fabrication processes, reference is made to the above mentioned copending Agusta et al. application.

It should now be apparent that an improved process for producing integrated circuits on a semiconductor wafer or other patterns on a substrate utilizing weighted mask matching and capable of carrying out the stated objects of the invention has been provided. Through use of the claimed process, combinations of masks which ordinarily would not have been chosen in a mask matching process, but which are capable of producing a substantially higher yield of defect-free patterns on a substrate are selected. By correlating mask selection in a mask matching process with process yield in the array, the invention concentrates the defect-free semiconductor device patterns of an array in a combination of masks at high process yield regions of the array.

While the invention has been particularly shown and described with reference to preferred embodiments thereof, it will be understood by those skilled in the art that various changes in form and details may be made therein without departing from the spirit and scope of the invention.

What is claimed is:

1. In a process for producing an array of integrated circuits on a semiconductor substrate using a plurality of masks in different levels to define a part of each integrated circuit in successive processing steps, in which nondefective patterns in masks of different level for producing an array of integrated circuits on a semiconductor substrate are overlaid to reduce randomly occurring defects in the integrated circuits produced by random defects in the masks, the improvement comprising:

a. determining at least two regions each of approximately equal but different process yield of defect-free integrated circuits in the array,
b. assigning weights to the integrated circuits in the regions based on the relative process yield of the regions,
c. selecting a combination of masks for the different levels on the basis of the number of the defect-free parts of the integrated circuits and the weight of the integrated circuits in the regions in which the defect-free parts are located in the array to maximize the number of defect-free integrated circuits produced in the array using the selected combination of masks, and
d. using a mask from the combination of masks so selected for defining successively a part of each integrated circuit in a light-responsive pattern defining medium in each of said successive processing steps.

2. The process of claim 1 wherein the semiconductor substrate is a silicon wafer and the integrated circuits are essentially identical.

3. The process of claim 1 in which the combination of masks is selected by:

a. taking a mask from a first one of the levels,
b. thereafter comparing the defect-free locations in masks from a second one of the levels with the defect-free locations in the mask from the first one of the levels,
c. then selecting a mask from the second level on the basis of the number of the defect-free array locations and the weight of the integrated circuits in the regions in which the defect-free parts are located to maximize the number of defect-free parts of integrated circuits that can be produced with the combination of first and second level masks,
d. thereafter comparing the defect-free locations in masks from a third one of the levels with the defect-free locations in the selected combination of first and second level masks, and
e. then selecting a mask from the third level on the basis of the number of the defect-free array locations and the weight of the integrated circuits in the regions in which the defect-free parts are located to maximize the number of defect-free parts of integrated circuits than can be produced with the combination of first, second and third level masks.

4. The process of claim 1 wherein the light-responsive pattern defining medium is photoresist.

5. A process for preparing an array of monolithic integrated circuits on a semiconductor wafer, using a plurality of masks in successive processing steps to define parts of the integrated circuits, the integrated circuits being subject to randomly occurring defects caused by random defects in the masks, comprising:

a. fabricating a number of masks for each processing step,
b. inspecting each mask to determine which random positions in the array contain defects in the masks,
c. recording the random defects for each mask on a suitable recording medium,
d. determining at least two regions of approximately equal but different integrated circuit process yield in the array,
e. assigning weights to the integrated circuits in the array based on the determined process yield,
f. comparing the location of the defect-free areas in masks for the plurality of processing steps,
g. selecting a particular combination of masks for the plurality of processing steps in accordance with the number of the defect-free integrated circuit areas on the masks and the weight of the integrated circuits in the regions in which the defect-free parts are located to maximize the number of nondefective integrated circuits produced in the array,
h. coating the semiconductor wafer with a photoresist,
i. using a first mask from the selected combination to expose the photoresist,
j. carrying out the remainder of a first processing step on the semiconductor wafer,
k. coating the semiconductor wafer with photoresist a second time,
l. using a second mask from the selected combination to expose the photoresist,
m. carrying out the remainder of a second processing step on the semiconductor wafer, and
n. continuing the plurality of processing steps on the semiconductor wafer using the remaining masks from the selected combination to expose photoresist on the semiconductor wafer.

6. The process of claim 3 wherein the light-responsive pattern defining medium is photoresist.